(12) United States Patent
Yen et al.

(10) Patent No.: US 6,265,296 B1
(45) Date of Patent: Jul. 24, 2001

(54) METHOD FOR FORMING SELF-ALIGNED CONTACTS USING A HARD MASK

(75) Inventors: Tzu-Shih Yen; Erik S. Jeng, both of Hsinchu; Hao-Chieh Liu, Taipei; Hung-Yi Luo, Sunchung, all of (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/436,688

(22) Filed: Nov. 8, 1999

(51) Int. Cl.[7] ................................................ H01L 21/3205
(52) U.S. Cl. ............................................ 438/586; 438/597
(58) Field of Search ........................................ 438/586, 595, 438/762, 769, 787, 770, 791, 597, 738, 695, 735, 710

(56) References Cited

U.S. PATENT DOCUMENTS

| 4,486,943 | * | 12/1984 | Ryden et al. | 29/571 |
| 5,286,667 | * | 2/1994 | Lin et al. | 438/396 |
| 5,352,621 | * | 10/1994 | Kim et al. | 438/253 |
| 5,872,063 | * | 2/1999 | Chao et al. | 438/762 |

* cited by examiner

Primary Examiner—David Nelms
Assistant Examiner—David Nhu
(74) Attorney, Agent, or Firm—Darby & Darby

(57) ABSTRACT

A method for making self-aligned contacts on a semiconductor substrate using a hard mask. After the transistor is formed, a blanket insulating layer is formed on said semiconductor substrate. A hard mask having openings on the blanket insulating layer is formed over the insulating layer. The openings overlay the source/drain region and part of the gate electrode structure. Using the patterned hard mask, the insulating layer is etched to the gate electrode protecting layer. Then self-aligned contacts is completed by etching the insulating layer to expose the source/drain regions using the gate electrode protecting layer and the insulating sidewall spacers as the mask.

5 Claims, 4 Drawing Sheets

METHOD FOR FORMING SELF-ALIGNED CONTACTS USING A HARD MASK

BACKGROUND OF THE INVENTION

1. Field of the Invention

The present invention relates to the fabrication of self-aligned contacts on semiconductor devices, and more particularly to a method for making self-aligned source/drain contacts on semiconductor devices using a hard mask.

2. Description of the Related Arts

Because the trend of semiconductor manufacturing is toward highly integrated semiconductor devises, the tolerance of the patterning has become stricter. A self-aligned contact which partially overlays the source/drain and the gate electrode is developed to increase the tolerance of mis-patterning and enhance the density of the integrated devises.

Conventional self-aligned contacts are typically fabricated by the following procedures. Referring to FIG. 1A, a gate oxide layer 112, a gate electrode structure 117 consisting of a gate electrode 114 and a gate protecting layer 116, a lightly doped region 118, a insulating sidewall spacer 120 on the sidewalls of gate electrode structure 117, and a heavily doped region 122 are successively fabricated on a semiconductor substrate 110. Then, an insulating layer 124 is depositing to blanket the substrate 110 and a photoresist 126 is formed on the insulating layer 124.

Turning to FIG. 1B, the conventional self-aligned contact 128 is completed by etching the insulating layer 124 to the gate electrode protecting layer 116 using the photoresist 126 as the mask, and then etching the insulating layer 124 to the heavily doped region using the gate electrode structure 117 and the sidewall spacers 120 together as the mask.

Unfortunately, several problems occurs because of the usage of photoresist as a mask. Photoresist, which is for the most part composed of organic compounds, generates by-products, such as organic polymers in the self-aligned contacts during the etching procedures. That leads to impairment of the devises or the need for additional procedures to remove the by-products. Another problem arises from the thickness of the photoresist, which is up to 5000–7000 Å on average. That results in a high aspect ratio which makes it difficult to define the self-aligned contacts.

SUMMARY OF THE INVENTION

It is therefore an object of the invention to present a method of forming self-aligned contacts which is free of the above problems.

According to the object of the invention, a method of forming self-aligned contacts using a hard mask is provided, which comprises the steps of: providing a semiconductor substrate; forming a gate oxide layer on said semiconductor substrate; forming a gate electrode layer on said gate oxide layer; forming a gate electrode protecting layer on said gate electrode layer; patterning said gate electrode protecting layer and said gate electrode layer, thereby forming gate electrode structures having vertical sidewalls; forming first doped regions in portions of said semiconductor substrate adjacent to said gate electrode structures; forming insulating sidewall spacers on said sidewalls of said gate electrode structures; forming second doped regions in portions of said semiconductor adjacent to said sidewall spacers; forming a blanket insulating layer on said semiconductor substrate; forming a hard mask having openings on said blanket insulating layer, said openings overlaying said first doped regions, said second doped regions and part of said gate electrode structure; etching said blanket insulating layer to said gate electrode protecting layer through said openings; etching said blanket insulating layer to expose said second doped regions using said gate electrode protecting layer and said insulating sidewall spacers as the mask, thereby forming said self-aligned contacts.

Other objects, features, and advantages of the present invention will become apparent from the following detailed description which makes reference to the accompanying drawings.

DETAILED DESCRIPTION OF THE INVENTION

Without intending to limit it in any manner, the present invention will be further illustrated by the following examples.

Figure 1A:
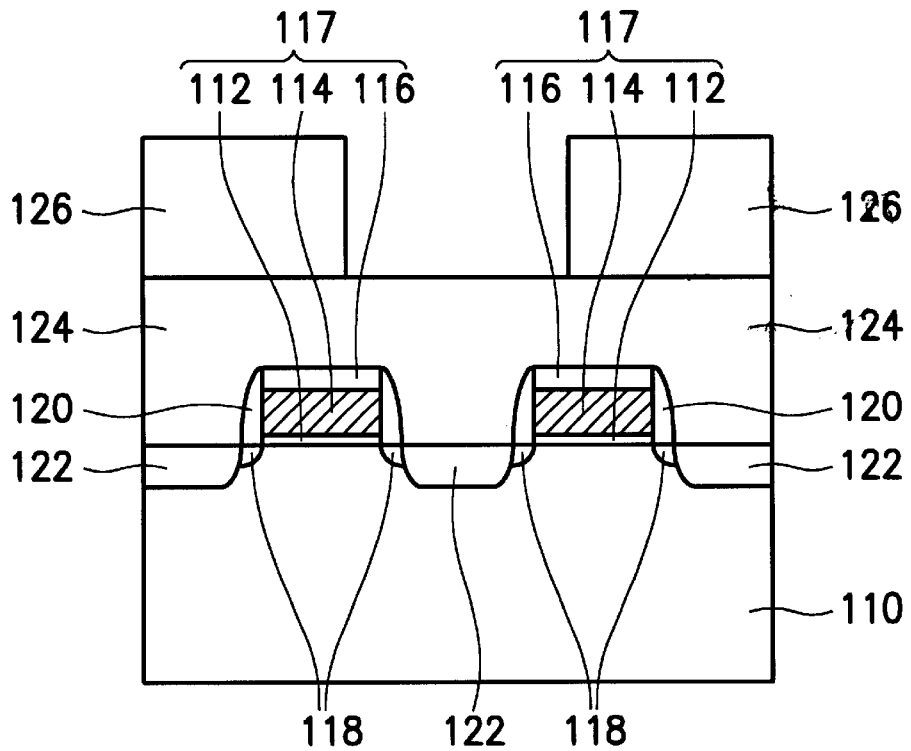
FIGS. 1A through 1B are cross-sectional views illustrating the fabrication steps of conventional self-aligned contacts using photoresist.
Figure 1B:
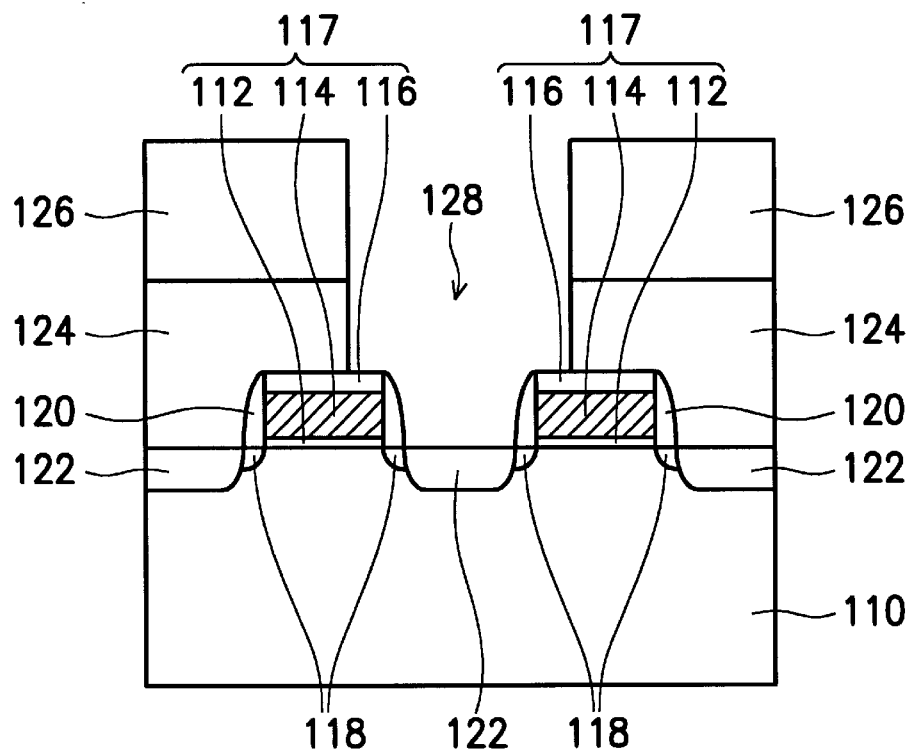
Figure 2A:
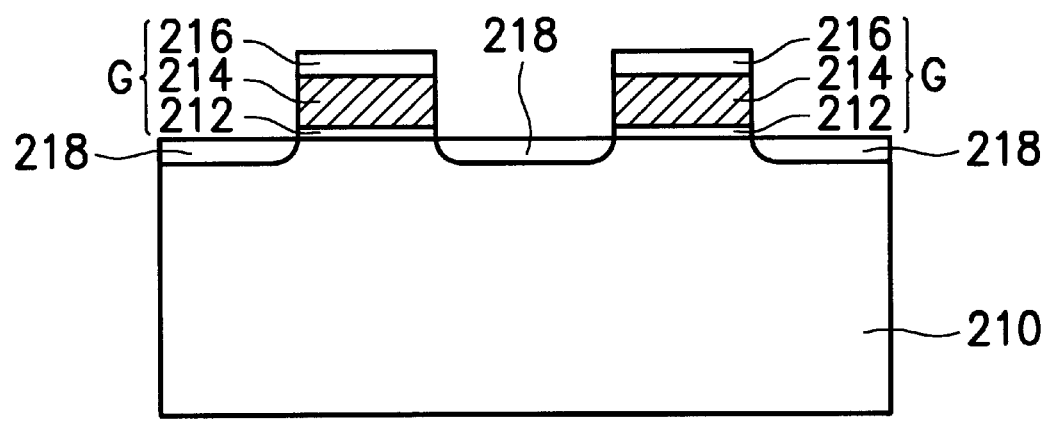
FIGS. 2 through 2F are cross-sectional views illustrating the fabrication steps of a crown capacitor according to the present invention.

Referring to FIG. 2A, the first step of the present invention is illustrated. A semiconductor substrate 210 is provided. Here, a P-type single crystal silicon having a <100> crystallographic orientation is used as a example. A gate oxide layer 212, a gate electrode layer 214 and a gate protecting layer 216 are successively formed over the substrate 210 and are patterned to form a gate electrode structure G using photolithography techniques and anisotropic techniques. The gate oxide layer 212 can be a silicon oxide layer which is, for example, formed by high temperature oxidation procedure in an oxygen ambient. The gate electrode layer 214 can be composed of doped polysilicon, deposited by chemical vapor deposition using, for example, silane as the reaction gas, and doped by ion implantation using, for example, either arsenic or phosphorus ion. The gate electrode protecting layer is preferably composed of silicon nitride, for example, by chemical vapor deposition using the dichlorosilane and ammonium as reactant gases.

A lightly doped region 218 is then formed by ion implantation using the gate electrode G as the mask. For instance, ion implantation using either arsenic or phosphorus ion can be performed in the P-type substrate.

Figure 2B:
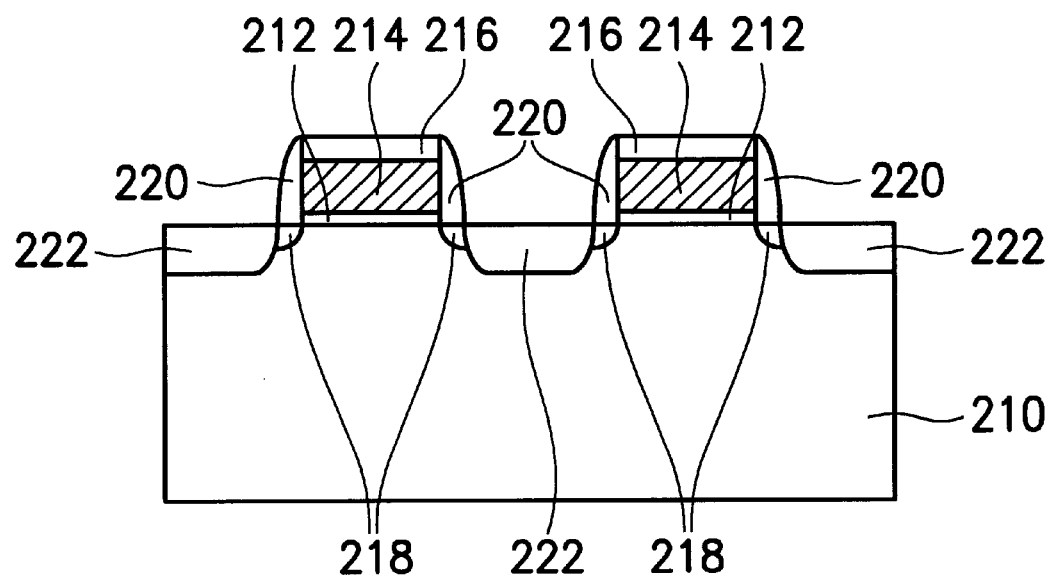

Referring to FIG. 2B, insulating sidewall spacers 220 are formed on the sidewalls of the gate electrode G. The insulating sidewall spacers 220 are fabricated by depositing and etching back an insulation layer. Preferably the gate electrode 220 are composed of silicon nitride, for example, by chemical vapor deposition.

A lightly doped region 218 is then formed in the substrate areas adjacent to the gate electrode spacers by ion implantation using the gate electrode structure G and the gate electrode spacers as the mask. For instance, ion implantation using either arsenic or phosphorus ion can be performed in the P-type substrate.

Moreover, after the heavily doped region 218 is formed, an insulating layer (not shown in FIG. 2B) can be formed over the gate electrode structure G and the insulating sidewall spacers 220. It will prevent the etching of the gate electrode 214 and lower the possibility of the short circuit. Therefore, an improved protection for the gate electrode 214 is obtained.

Figure 2C:
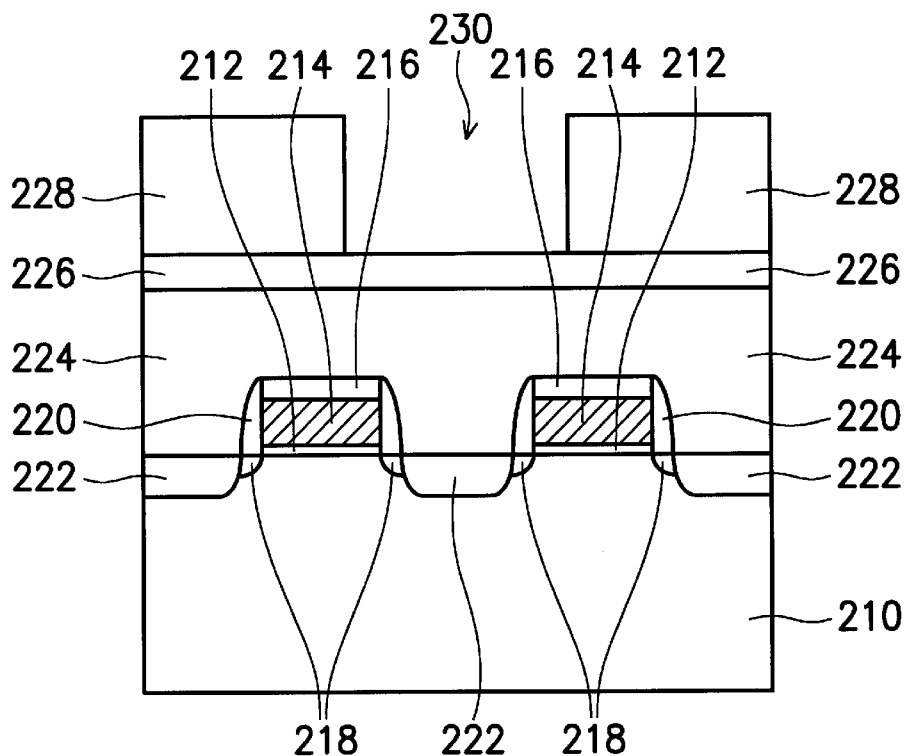

Now, turning to FIG. 2C, a insulating layer 224 is formed thereon to isolate the transistor and conducting layers which will be formed later and to offer a good planar surface for the following procedure. In one embodiment, the insulating layer 224 is composed of silicon oxide, for example, by chemical vapor deposition method using tetraethyl-orthosilicate (TEOS) as the reactant gas.

Then a hard mask 226 and a photoresist film 228 are formed over the insulating layer 224 successively. The photoresist film 228 has openings 230, each of which overlaps the lightly and heavily doped region 218 and 222 and part of the gate electrode structure G. Preferably the hard mask 226 is composed of non-silicon oxide material, for example, a material selected from the group consisting of polysilicon, silicon nitride, aluminum oxide, silicon oxynitride and Ti/titanium nitride. The preferable thickness of the hard mask 226 is between 1000 and 2000 Å.

Figure 2D:
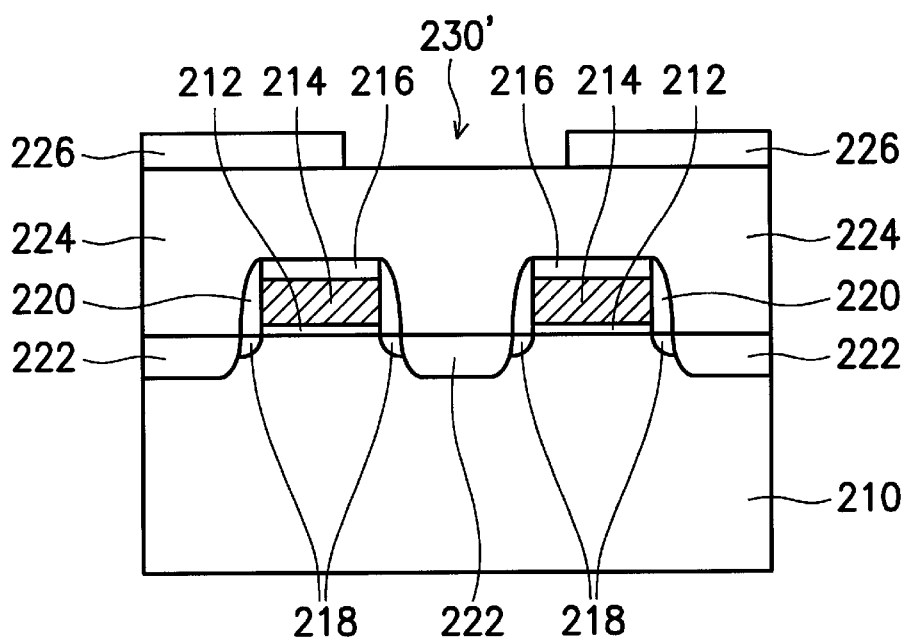

Referring now to FIG. 2D, conventional photolithography and an anisotropical technique are used to form opening 230' in the hard mask 226, which exposes portions of the insulating layer 224. The exposed regions will define the location of the self-aligned contacts. The photoresist film 228 is carefully removed by wet washing.

Figure 2E:
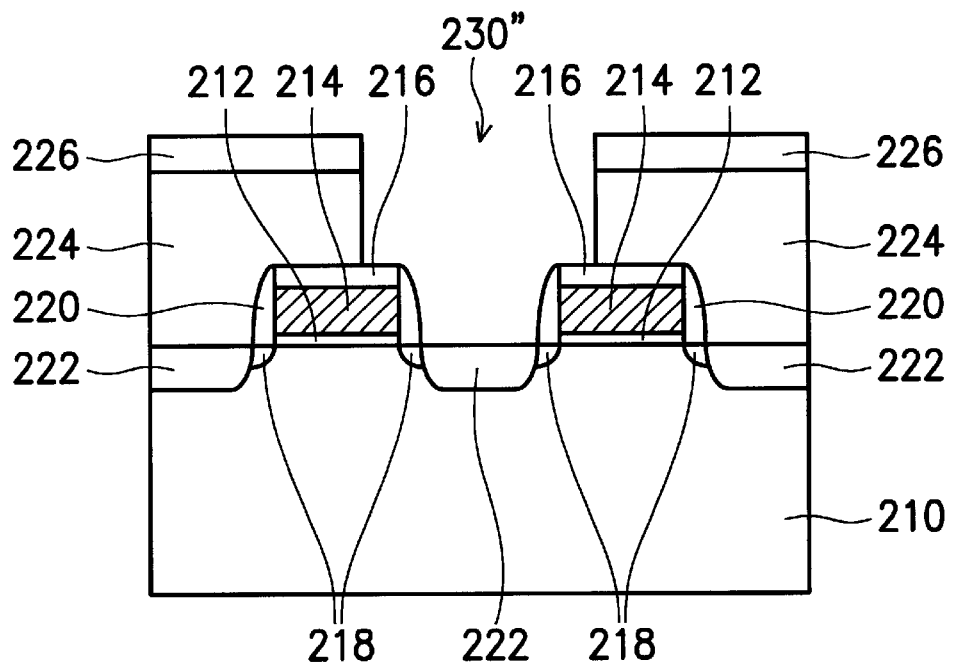

Referring to FIG. 2E, conventional photolithography and anisotropical techniques are used to form self-aligned contacts 230" in the insulating layer 224. The anisotropical techniques must be more susceptible to insulating layer than to gate electrode protecting layer 216 and gate electrode spacers 220. For example, the insulating layer 224 composed of silicon oxide is etched by ion reactive etching using dichloromethane/$CF_4$ as reactant gases.

Figure 2F:
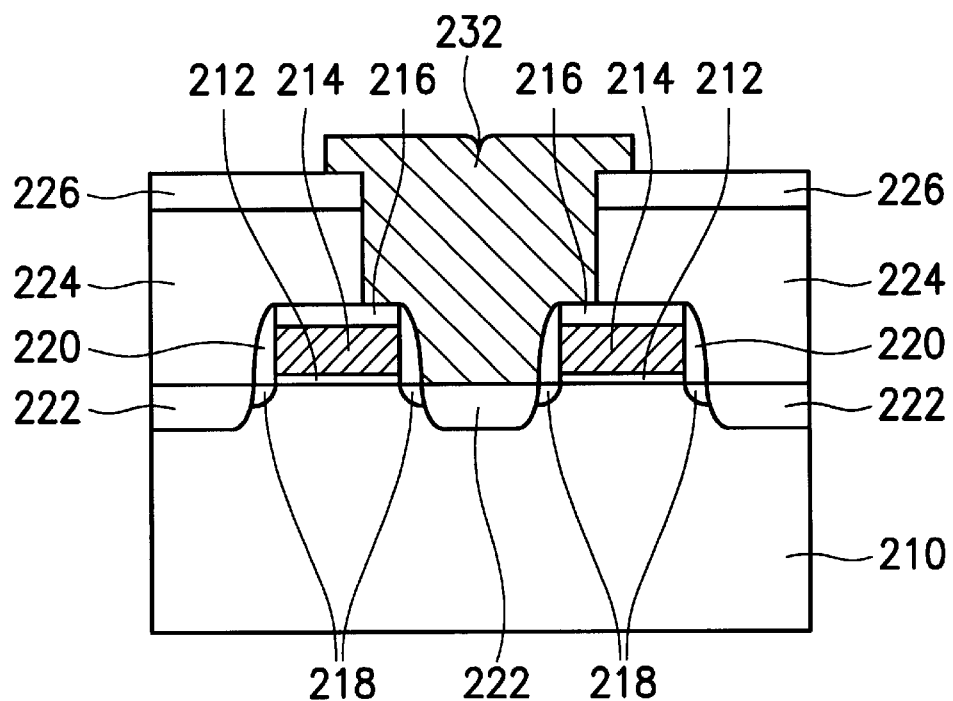

Referring to FIG. 2F, the self-aligned contacts can be filled with a conducting layer 232 which is composed of, for example, polysilicon or metal silicide such as titanium silicide or tungsten silicide.

According to the present invention, advantages are derived from usage of a hard mask instead of photoresist as the mask. One is that aspect ratio of the self-aligned contact is lowered because the thickness of the hard mask, between 1000 and 2000 Å, is thinner than that of the conventional photoresist film, between 5000 and 7000 Å. Another is that no organic polymer byproduct is generated because of the material of the hard mask is inorganic compound. Moreover, hard mask can endure higher temperature than the photoresist, so higher processing temperatures can be utilized.

While the invention has been particularly shown and described with the reference to the preferred embodiment thereof, it will be understood by those skilled in the art that various changes in form and details may be made without departing from the spirit and scope of the invention.

What is claimed is:

1. A method of forming self-aligned contacts on a semiconductor substrate using a hard mask, which comprises the steps of:

providing a semiconductor substrate;

forming a gate oxide layer on said semiconductor substrate; forming a gate electrode layer on said gate oxide layer;

forming a gate electrode protecting layer on said gate electrode layer; patterning said gate electrode protecting layer and said gate electrode layer, thereby forming gate electrode structures having vertical sidewalls;

forming first doped regions in portions of said semiconductor substrate adjacent to said gate electrode structures;

forming insulating sidewall spacers on said sidewalls of said gate electrode structures;

forming second doped regions in portions of said semiconductor adjacent to said sidewall spacers;

forming a blanket insulating layer on said semiconductor substrate;

forming a hard mask having openings on said blanket insulating layer, said openings overlaying said first doped regions, said second doped regions and part of said gate electrode structure wherein said hard mask has a thickness generally between 1000 and 2000 angstroms (Å);

etching said blanket insulating layer to said gate electrode protecting layer through said openings;

etching said blanker insulating layer to expose said second doped regions using said gate electrode protecting layer and said insulating sidewall spacers as the mask, thereby forming said self-aligned contacts wherein said hard mask is composed of a material consisting of polysilicon, silicon nitride, aluminum oxide, silicon oxynitride and titanium nitride.

2. The method as claimed in claim 1, wherein said openings are formed by forming a photoresist and anisotropically patterning said hard mask using said photoresist pattern as the mask.

3. The method as claimed in claim 2, wherein further including filling said self-aligned contacts with conducting material.

4. The method as claimed in claim 1, wherein said gate electrode protecting layer and said insulating sidewall spacers are composed of the same material.

5. The method as claimed in claim 1, wherein both of said gate electrode protecting layer and said sidewall spacers are composed of silicon nitride.

* * * * *

UNITED STATES PATENT AND TRADEMARK OFFICE
CERTIFICATE OF CORRECTION

PATENT NO. : 6,265,296 B1  Page 1 of 1
DATED : July 24, 2001
INVENTOR(S) : Tzu-Shih Yen, Erik S. Jeng, Hao-Chieh Liu and Hung-Yi Luo It is certified that error appears in the above-identified patent and that said Letters Patent is hereby corrected as shown below:

<u>Title page,</u>
Please add: -- [30] Foreign Application Priority Data
March 4, 1999  Taiwan, R.O.C………………..088103295 --.

Signed and Sealed this

Eleventh Day of June, 2002

Attest:

Attesting Officer

JAMES E. ROGAN
*Director of the United States Patent and Trademark Office*